(12) United States Patent
Yang et al.

(10) Patent No.: US 7,224,628 B2
(45) Date of Patent: May 29, 2007

(54) ADAPTIVE ALGORITHM FOR MRAM MANUFACTURING

(75) Inventors: Hsu Kai Yang, Pleasanton, CA (US);
Xi Zeng Shi, Fremont, CA (US);
Po-Kang Wang, San Jose, CA (US);
Bruce Yang, Pleasanton, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 0 days.

(21) Appl. No.: 11/486,192

(22) Filed: Jul. 13, 2006

(65) Prior Publication Data

US 2006/0250867 A1 Nov. 9, 2006

Related U.S. Application Data

(62) Division of application No. 10/889,911, filed on Jul. 13, 2004, now Pat. No. 7,085,183.

(51) Int. Cl.
*G11C 7/00* (2006.01)
(52) U.S. Cl. ............... 365/201; 365/158; 365/185.08; 365/189.02; 365/189.05; 365/96; 365/154; 365/230.03; 365/230.08
(58) Field of Classification Search .......... 365/189.02, 365/189.05, 230.03, 230.08, 158, 154, 201, 365/96, 185.08
See application file for complete search history.

(56) References Cited

U.S. PATENT DOCUMENTS

| 6,477,081 | B2 | 11/2002 | Poechmueller | |
|---|---|---|---|---|
| 6,639,848 | B2 | 10/2003 | Maejima | |
| 6,639,859 | B2 | 10/2003 | Tran | |
| 6,862,235 | B2 * | 3/2005 | Sakata et al. | 365/202 |
| 6,947,315 | B2 * | 9/2005 | Iwata | 365/158 |
| 6,950,334 | B2 * | 9/2005 | Shimizu et al. | 365/158 |
| 7,051,260 | B2 * | 5/2006 | Ito et al. | 714/754 |
| 2003/0210596 | A1 | 11/2003 | Perner | |
| 2004/0042262 | A1 | 3/2004 | Tran et al. | |
| 2004/0090835 | A1 | 5/2004 | Miyatake et al. | |

* cited by examiner

*Primary Examiner*—Hoai V. Ho
(74) *Attorney, Agent, or Firm*—Saile Ackerman LLC; Stephen B. Ackerman (57) ABSTRACT

Magnetic Random Access Memory (MRAM) can be programmed and read as fast as Static Random Access Memory (SRAM) and has the non-volatile characteristics of electrically eraseable programmable read only memory (EEPROM), FLASH EEPROM or one-time-programmable (OTP) EPROM. Due to the randomness of manufacturing process, the magnetic tunnel junctions (MTJ) in MRAM cells will require different row and column current combinations to program and not to disturb the other cells. Based on adaptive current sources for programming, this disclosure teaches methods, designs, test algorithms and manufacturing flows for generating EEPROM, FLASH EEPROM or OTP EPROM like memories from MRAM.

21 Claims, 9 Drawing Sheets

ADAPTIVE ALGORITHM FOR MRAM MANUFACTURING

This is a Divisional application of U.S. patent application Ser. No. 10/889,911, filed on Jul. 13, 2004 now U.S. Pat. No. 7,085,183, which is herein incorporated by reference in its entirety, and assigned to a common assignee.

BACKGROUND OF THE INVENTION

1. Field of the Invention

The present invention generally relates to magnetic random access memory (MRAM). More particularly, this invention relates to maximizing the total yield of MRAM, by making MRAM which has the ability to adapt the row and column programming currents for individual cells which allows MRAM to be used as either static RAMs, one-time-programmable RAMs or electrically alterable or flash RAMs.

2. Description of the Prior Art

Figure 1:
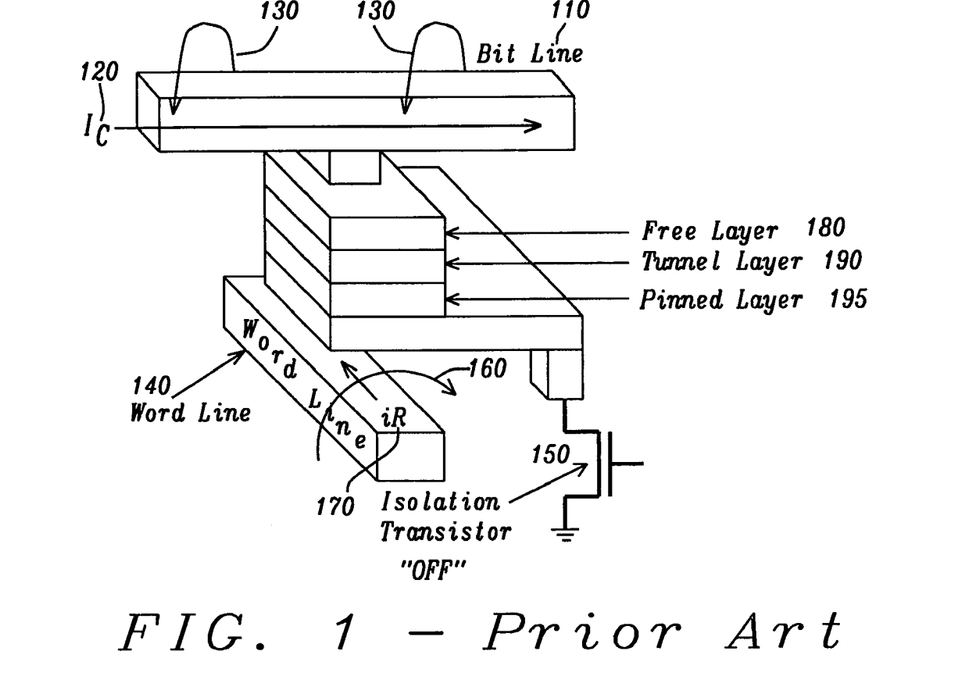
FIG. 1 is a prior art magnetic random access (MRAM) memory cell with a Magnetic Tunnel Junction (MJT), isolation transistor, word line and bit line.
Figure 2:
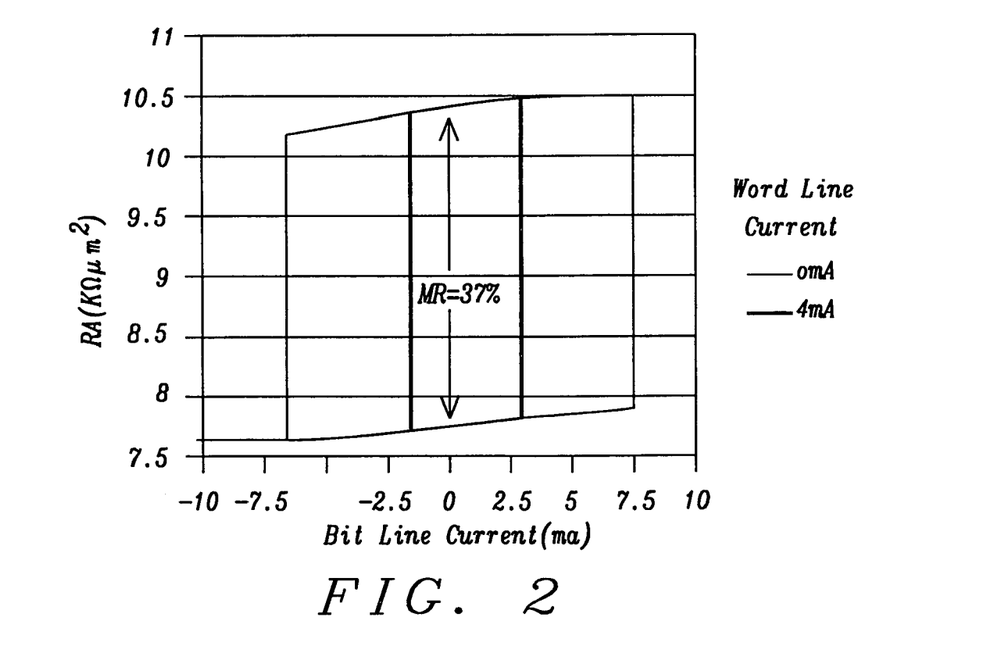
FIG. 2 is a hysteresis loop of a Magnetic Tunnel Junction.
Figure 3:
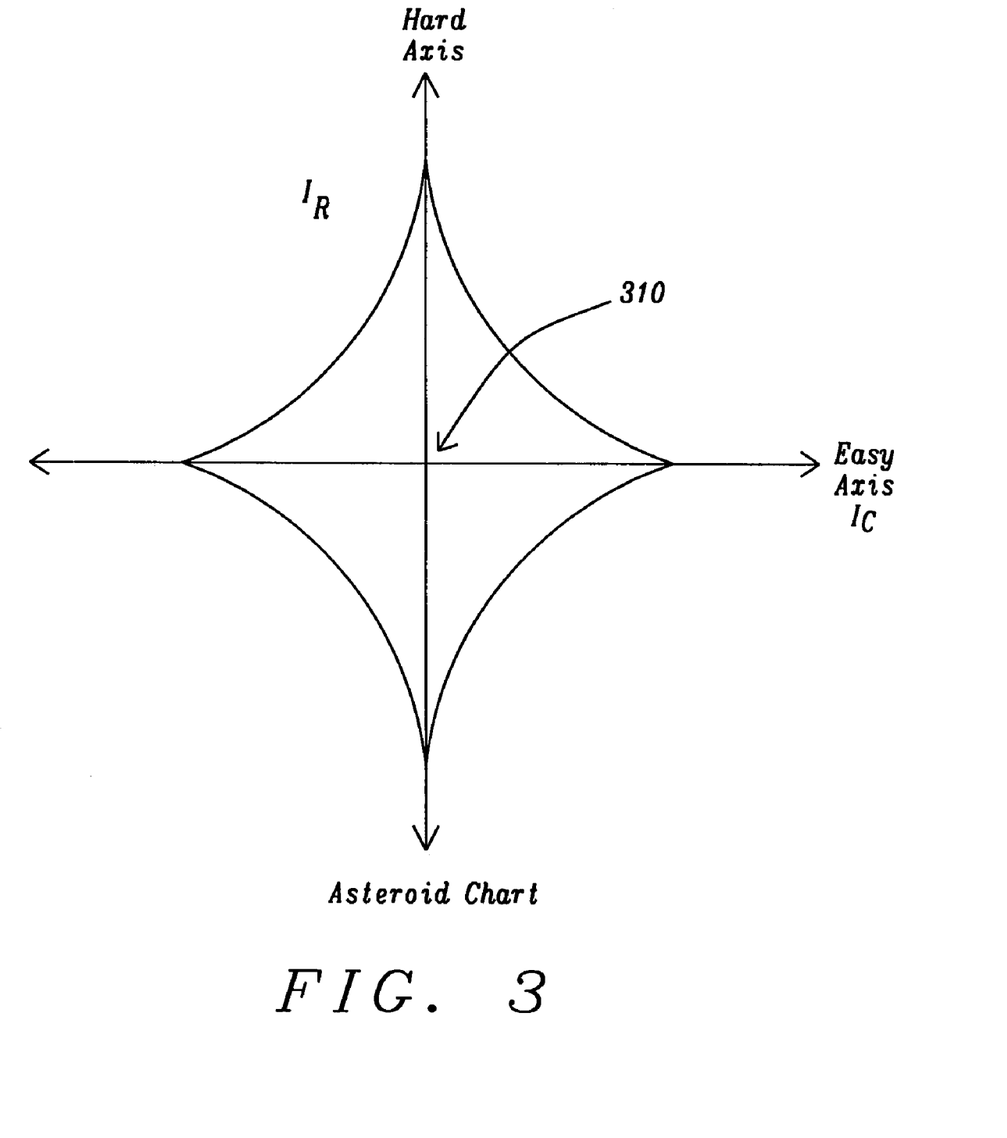
FIG. 3 is an asteroid chart of the programming capability of a single MTJ MRAM cell.

A typical MRAM memory cell with an isolation transistor is shown in FIG. 1. A bit line 110 and its current 120 and the resultant magnetic field 130 are shown in FIG. 1. In addition, a word line 140 and its current 170 and the resultant magnetic field 160 are shown in FIG. 1. The three layers that comprise the memory cell are shown in FIG. 1. Two layers of ferromagnetic material, the free layer 180 and the pinned layer 195 are shown above and below an insulation layer such as oxide 190. An isolation transistor is also shown in FIG. 1. The MTJ, Magnetic Tunnel Junction, exhibits a hysteresis characteristic as shown in FIG. 2. Two distinct states of a memory cell are based on its resistance ratio whether the free layer and pinned layer magnetic fields are parallel or anti-parallel. The ratio of increase in resistance (delta R) when the fields are anti-parallel can be up to 50% with present technology. In order to write two different states into cells, cross points of two current components are needed. In FIG. 2, the word line current is equivalent to the row current (IR) and the bit line current is equivalent to the column current (IC). FIG. 2 shows two hysteresis loops of a single MTJ. When word line current is 0 mA, it requires +−7.5 mA of bit line current to switch the field direction of free layer. However, when there is 4 mA word line current, the bit line current needed to switch the field direction of the free layer is around +−2.5 mA. The resistance of MTJ changed from 7.6 kohm to 10.5 kohm, a 38% increase. FIG. 2 also shows a slight asymmetry in the hysteresis in that more bit line current is required to switch the MTJ from low resistance to high resistance than the other way around. In FIG. 3, the minimum word line and bit line currents needed to switch the magnetic field of the free layer of a single MTJ are shown. Any bias point (combination of word line/row current, IR and bit line/column current, IC) inside the asteroid area 310 will not switch the direction of free layer magnetic field. Any points outside the asteroid 310 area will switch the direction of magnetic field or unintentionally disturb the MTJs sharing the same word line or bit line. When a large number of MTJs used to make a memory array, the characteristics of each MTJ may vary significantly due to random process variation. The asteroid chart of FIG. 3 will be the composite of all the MTJs in the array. Choosing a fixed biasing point (IR and IC) such that all the MTJs can be switched in both directions and not disturbing MTJs along the same row or column can be a difficult task.

The MRAM cells forming a memory array are organized in rows and columns. They are programmed by row current and column current. The cells at cross points of the row and column programming currents get programmed. The cells sharing the same row and column lines will see its respective row or column current. These cells must not be unintentionally programmed or disturbed with one of the current components. Due to the randomness of the manufacturing process, the current levels needed to program the intended cells and not to disturb the cells sharing the same row line and bit Line will be different for the entire memory array. The problem gets significantly worse when the array is very big.

Figure 4:
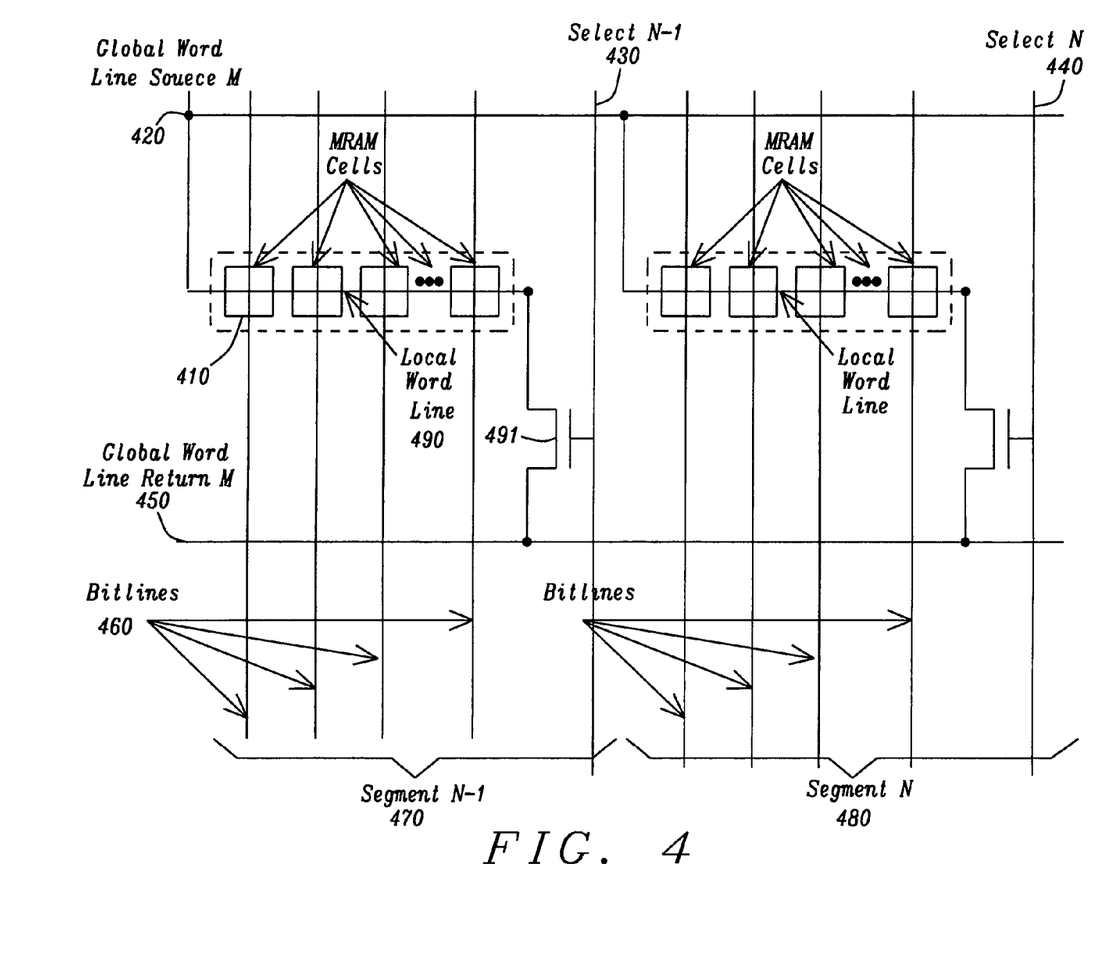
FIG. 4 is a prior art array of MRAM cells organized so that the word lines are segmented.

By partitioning the array into local word lines, as in FIG. 4, the possible disturbs will only occur on the cells sharing same bit lines of the byte being programmed. By adjusting the programming currents for each byte, the probability of programming every cell and not disturbing other cells in a memory array is greatly improved. FIG. 4 shows segment N−1 (470) and segment N (480) where N is any number from 1 increasing. Segment N−1 memory cells 410 are shown along with a segmented word line select transistor 491. The segmented word line select transistor 491 has a return line attached to the Global Word line return 450. The segmented word line select transistors along with the global word line 420 are used to include or exclude a segment, byte or group of bytes from the effects of memory cell programming. The global word lines such as 420 in FIG. 4 and the local word lines such as 490 in FIG. 4 are the rows referred to in FIG. 1 and the bit lines 460 in FIG. 4 are the columns referred to in FIG. 1.

Figure 5:
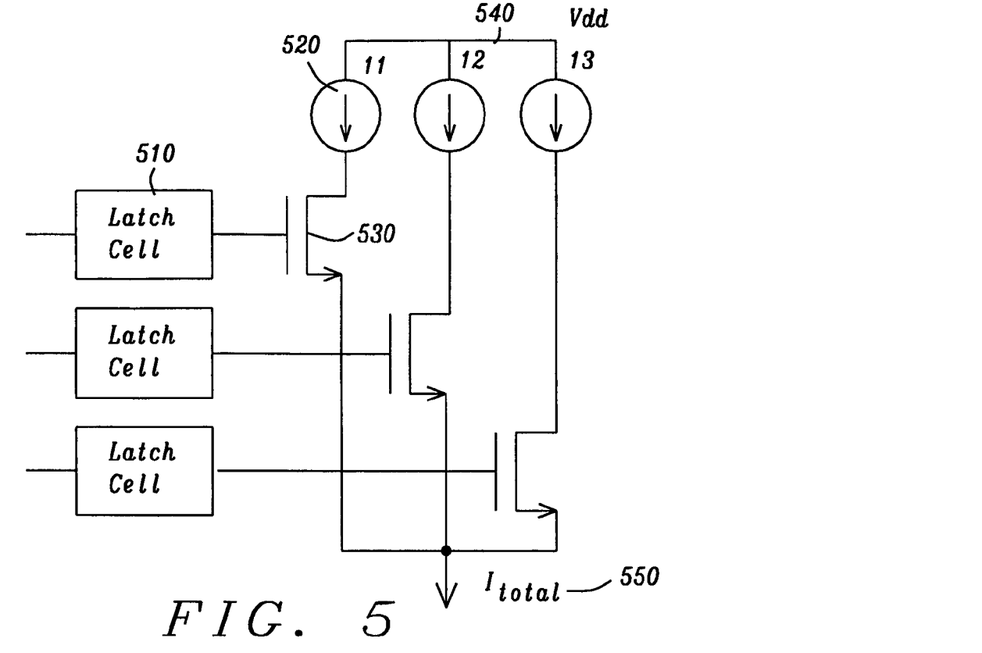
FIG. 5 is a typical programmable adaptive current source.
Figure 6:
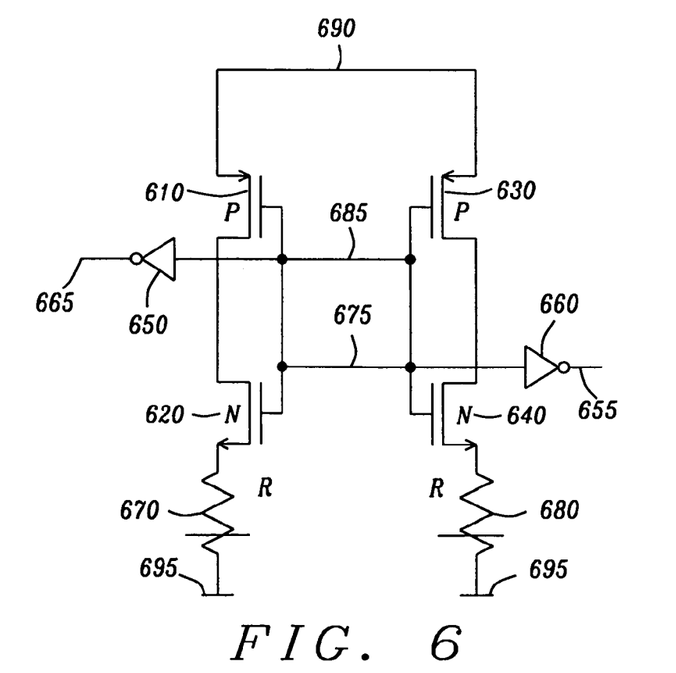
FIG. 6 is a typical non-volatile latch used to set the adaptive current source.

FIG. 6 shows a non volatile latch implemented with MTJ and FIG. 5 shows an adaptive current source which can be programmed by the non volatile latches to adjust the current level. They are shown as one way of changing programming current. Any one well versed in this art can implement adaptive current sources in many different ways. FIG. 5 uses the latch cells 510 detailed in FIG. 6. There are three current sources 520 which are selectively combined using the selective activation of transistor devices such as 530. A combined, total current, (I total), 550, is the resultant adaptive current. A Vdd power supply 540 is shown supplying the power to the current sources, I1, I2, and I3.

In FIG. 6, non-volatile latch is implemented with two p-channel metal oxide semiconductor field effect transistors, PMOS FETs, 610, 630, two n-channel metal oxide semiconductor field effect transistors, NPMOS FETs, 620, 640, two variable resistors, preferably MJTs, 670, 680 and two inverters, 650, 655. A Vdd power supply, 690, and ground 695 are shown. In addition, the latch outputs are 655 and 665, and the latch inputs are 675 and 685.

As stated above, due to the randomness of the manufacturing process, the current levels needed to program the intended cells and not to disturb the cells sharing the same row line and bit Line will be different for the entire memory array. Today's technology allows the building of larger and larger MRAM arrays causing the above problems to get even worse. Even with the segmenting of arrays described above, many magnetic chips must be discarded, since a viable combination of row current and column current cannot be found which fits into the asteroid area 310 of FIG. 3.

U.S. Pat. No. 6,639,848 (Maejima) discloses die testing of MRAM or EEPROM devices to detect defective chips and recover them if possible.

U.S. Pat. No. 6,639,859 (Tran) shows a test apparatus to test arrays of various sizes.

U.S. Pat. No. 6,477,081 (Poechmueller) describes a method for testing MRAM memory cells.

SUMMARY OF THE INVENTION

It is therefore an object of the present invention to provide algorithm or test flows to separate the MRAM chips which fail to meet fast WRITE requirement into chips which can be used for one-time-programmable (OTP) electrically programmable read only memory (EPROM) type of application. It is further an object of this invention to provide a block diagram of a MRAM die where the on chip algorithm controller is described.

The objects of this invention are achieved by a method of adaptively programming and testing magnetic random access memory. The method comprises the steps of setting a nominal row current, setting a nominal column current, writing input data to an entire array, reading data from said entire array, comparing said reading data with said writing input data, and signaling a mismatch failure if said comparing of said reading data with said writing input data results in a negative comparison. Additional method steps include changing row or column current in order to attempt a finite list of row current and column current combinations if said signaling a mismatch failure does occur, deciding if all said row current and column current combinations have been tried, repeating the writing, reading, and comparing steps above if said signaling a mismatch failure does occur and all said row current and column current combinations have not been tried, signaling a bad die if said signaling a mismatch failure does occur and all said row current and column current combinations have been tried, fixing nominal row and column current if said signaling a mismatch failure does not occur, and signaling a good die if said signaling a mismatch failure does not occur.

The above and other objects, features and advantages of the present invention will be better understood from the following detailed description taken in conjunction with the accompanying drawings.

DESCRIPTION OF THE PREFERRED EMBODIMENT

In the prior art section, it was described that by partitioning the array into local word line, as in FIG. 3 the possible disturbs will only occur on the cells sharing same bit lines of the byte being programmed. By adjusting the programming currents for each byte, the probability of programming every cell and not disturbing other cells in a memory array is greatly improved. The algorithm of adjusting programming currents for random bytes in an array will increase the write time. However, long write time is acceptable for one-time-programmable (OTP) electrically programmable read only memory (EPROM) type applications when programming is externally controlled by the programmer using an external programming unit and tester. Also, for electrically eraseable programmable read only memory (EEPROM) or FLASH EEPROM type applications which can tolerate programming time from hundreds of microsecond to tens of millisecond, the programming can be controlled by on chip circuitry. It is the intent of this invention to teach the methods, designs, test algorithms and manufacturing flows to maximize the total yield of MRAM into SRAM, EEPROM, FLASH EEPROM and OTP EPROM applications.

Figure 7:
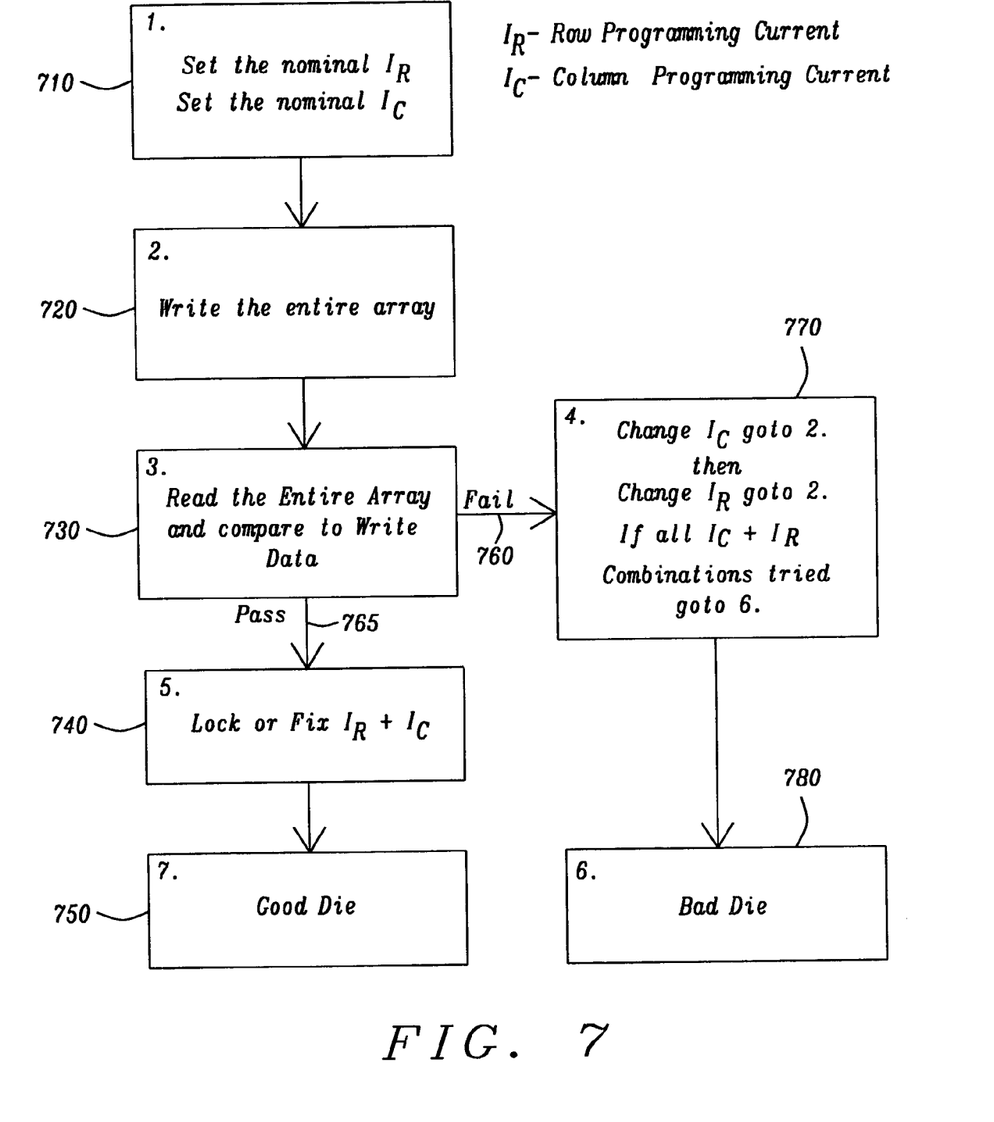
FIG. 7 which is the first embodiment of this invention is a method for programming and testing an MRAM memory array with adaptive row and column programming current.

FIG. 7 shows the first embodiment of this invention which is a method for programming and testing an MRAM memory array with adaptive row and column programming current. The first step 710 is to set an initial nominal row programming current, IR, and an initial nominal column programming current, Ic. Using these initial programming currents, all of the magnetic memory array cells are written 720. Next, all of the magnetic memory array cells are read back and compared to the cell values previously written 730. If all of the comparisons between the memory cell data Read and the memory cell data previously written pass 765, the method continues by locking in or fixing IR and Ic 740. Also, the method flow ends by signaling a good die 750. If any of the comparisons between the memory cell data Read versus the memory cell data previously written fail 760, a branch to a step to change the adaptive column current of the adaptive row current is taken. The column or row programming currents are changed until all of the valid IC+IR combinations are attempted 770. Then, the method branches back to the previous step of writing all of the memory cells 720. This is followed by repeating the reading of all of the memory cells and comparing the data Read with the previously written memory cell data. Again, if any of the comparisons fail 760, the column or row programming currents are changed until all of the valid IC+IR combinations are attempted 770. If "fails" 760 still occur, after attempting all of the IC+IR combinations, then the method flows stops by signaling a bad die 780. This ends the programming and testing of an MRAM array chip for its use as a Static Random Access Memory, SRAM.

Figure 8:
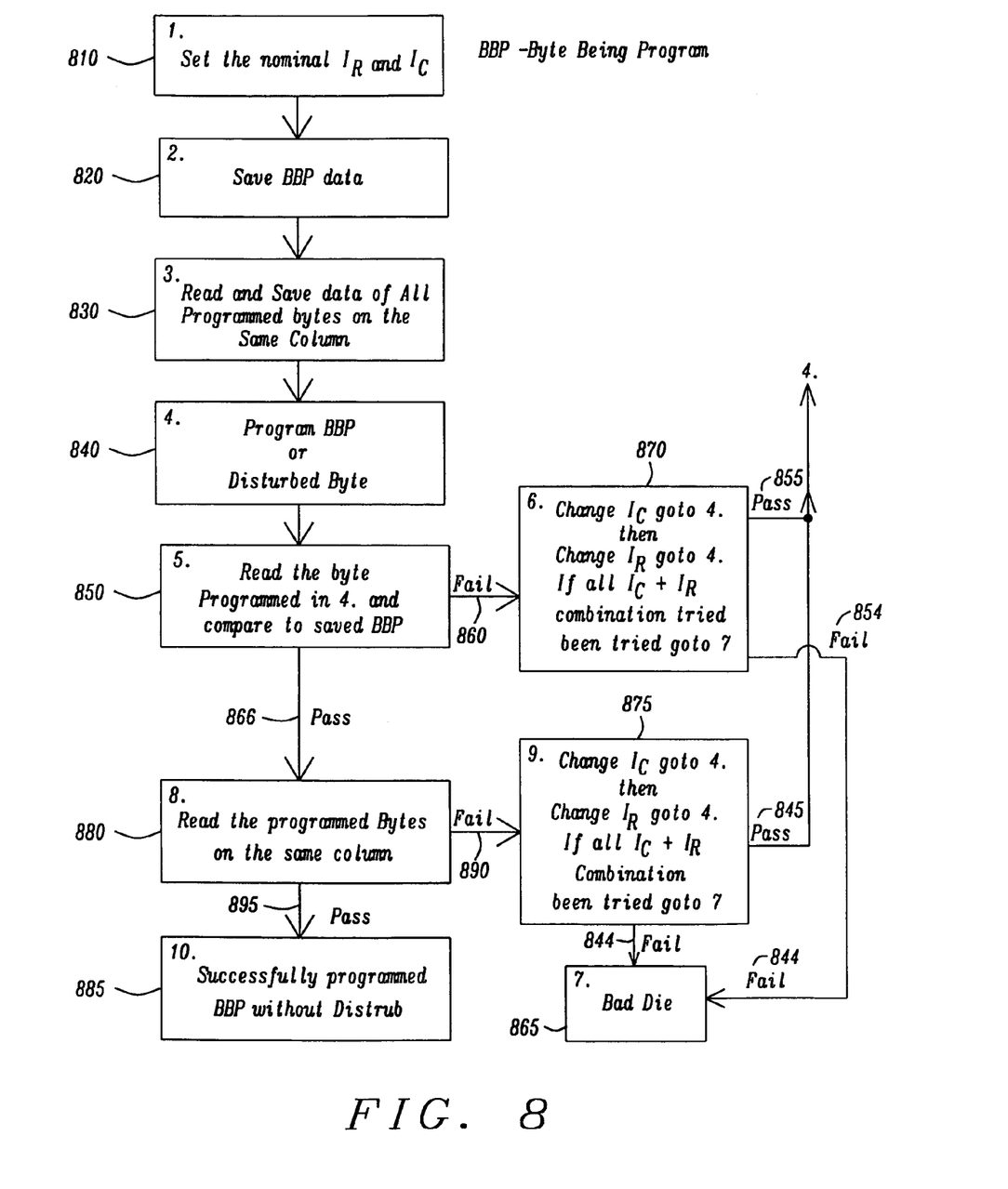
FIG. 8 which is the second embodiment of this invention is a method for programming and testing a random byte within a memory array with any combination of adaptive row and column currents.

FIG. 8 shows the second embodiment of this invention, which is a method for programming and testing a random byte within a memory array with any combinations of adaptive row and column currents. The first step 810 is to set an initial nominal row programming current, IR and an initial nominal column programming current, Ic. The next step is to save the byte being programmed 820. Next, all of the programmed bytes on the same column as the byte being programmed (BBP) are read and saved 830. Next, the method programs the byte being programmed 840. Then, the byte being programmed in 840 is read back and compared to the original saved BBP data 850. If the comparison passes 866, the method reads the programmed bytes on the same column as BBP 880 and compares these read bytes with the previously-saved programmed bytes on the same column as BBP 880. If this comparison passes 895, the method ends by signaling 885 that it successfully programmed the BBP without disturbs the other bytes on the same column as BBP.

If the reading of the BBP and its comparison to the previously saved BBP fails 860, a branch to a step to change the adaptive column current or the adaptive row current is taken. The column or row programming currents are changed until all of the valid IC+IR combinations are attempted 870. If "fails" 854 occur after attempting all of the IC+IR combinations, then the method flow stops by signaling a bad die 865.

If the reading of the programmed bytes on the same column and its comparison to the previously saved programmed bytes on the same column fails 890, a branch to a step to change the adaptive column current or the adaptive row current is taken 890. The column or row programming currents are changed until all of the valid IC+IR combinations are attempted 875. If "fails" 844 occur after attempting all of the IC+IR combinations, then the method flow stops by signaling a bad die 865. If "pass" occurs 845, the method repeats the programming BBP step 840 and continues the flow again.

The above method flow could also be used to "repair" or correct bytes disturbed by previous attempts to program and test array bytes. Also, the above method flow could also be used for bytes on the same row or word line. In this corollary application, all of the references to columns above would be changed to rows.

Figure 9:
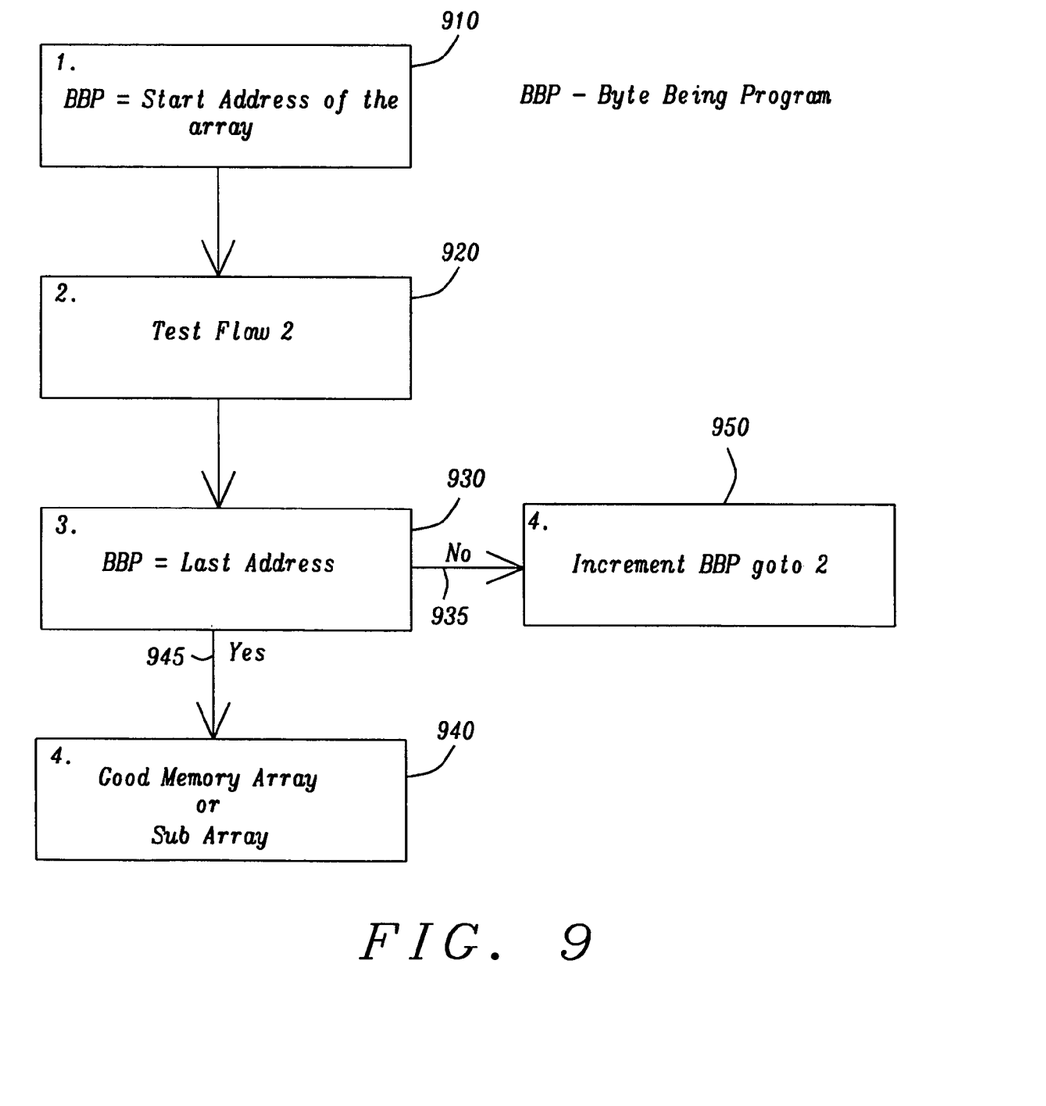
FIG. 9 which is the third embodiment of this invention is a method for programming an entire memory array with random combinations of adaptive row and column programming currents.

FIG. 9 shows the third embodiment of this invention, which is a method for programming an entire memory array with random combinations of adaptive row and column programming currents. The first step 910 sets the byte being programmed (BBP) to the start address of the array. Next, with this BBP the method calls the previously defined method or flow described in FIG. 8. FIG. 8 is the method of programming and testing a single random byte within a magnetic memory array. After completing the successful writing of the BBP, the flow in FIG. 9 goes to 930, which checks if BBP is the last address of the memory array being programmed. If the result of this decision block 930 is 'Yes', the flow signals a Good Memory array or sub array and ENDS the flow. If the result of this decision block 930 is 'No', the BBP is incremented 950 and the flow goes to 920, which is a repeat of Test flow 2 as shown in FIG. 8 with the new BBP. In this manner, an entire memory array or sub array is programmed and tested using the test flow 2 shown in FIG. 8. If there are die failures, they will be according to the failures described in Test flow 2 shown in FIG. 8.

Figure 10:
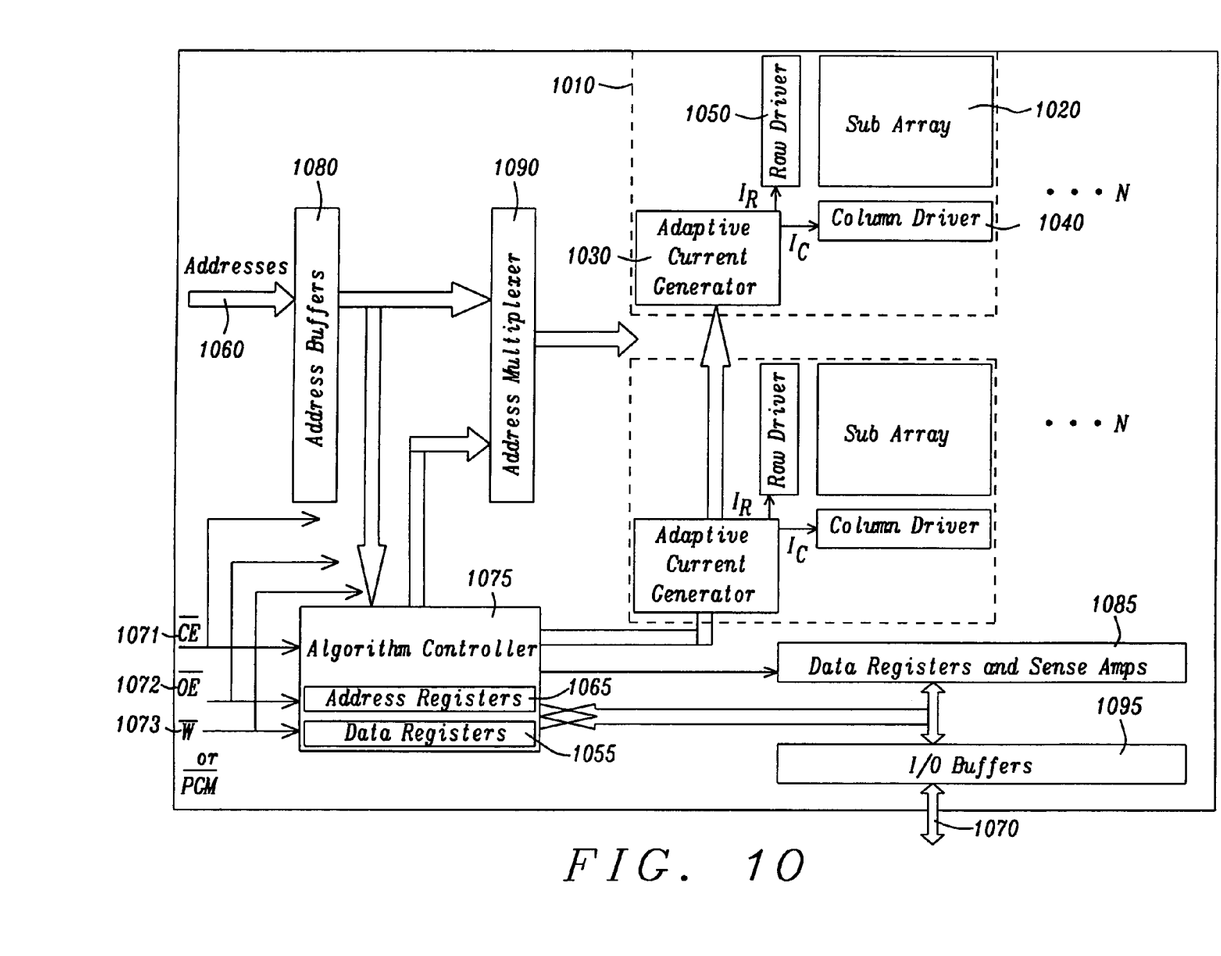
FIG. 10 is a block diagram of a circuit embodiment of an MRAM with on chip adaptive current generators and algorithm controller.

FIG. 10 is a block diagram of a circuit embodiment of an MRAM with on chip adaptive current generators and algorithm controller. The primary inputs to the MRAM include an address bus 1060, a bi-directional data bus 1070 and control lines. These control lines include a chip enable 1071, an output enable 1072 and a write (program) signal 1073. The address lines 1060 drive address buffers 1080. The address buffer output feeds the address multiplexer 1090. The address multiplexer selects between the external address bus and the output of internal address registers. The internal address registers are driven by the algorithm controller 1075. The algorithm controller implements the method flows of FIGS. 7, 8, and 9. These methods require the ability to preset the address registers to the required values. The bi-directional data bus 1070 interfaces with the I/O buffer 1095. These I/O buffers in turn interface with the data registers and sense amps 1085 and with the data registers 1055 associated with the algorithm controller 1075. The memory sub unit 1010 is composed of a memory sub array 1020, a row driver 1050, a column driver 1040 or drivers for bi-directional bit line currents and an adaptive current generator 1030. The memory sub unit 1010 can write a byte of data such as '10110011' by placing '10110011' values on the 8 column drivers and by activity the word driver that selects the Byte Being Programmed (BBP).

Figure 11:
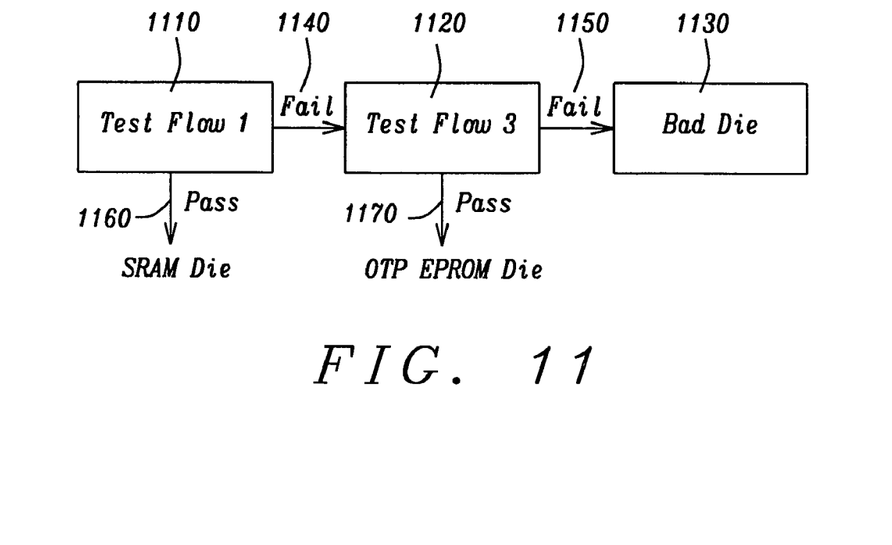
FIG. 11 which is the fourth embodiment of this invention is a method for programming, testing and sorting an MRAM chip to generate one-time-programmable electrically programmable read only memory (EPROM) without on chip adaptive row and column programming current and algorithm controller.

FIG. 11, which is the fourth embodiment of this invention is a method for programming, testing and sorting an MRAM chip to generate one-time-programmable electrically programmable read only memory (EPROM) without on chip adaptive row and column programming current and algorithm controller. This implies that on a chip as described in FIG. 10, the algorithm controller 1075 is external to the chip in an external tester. The method described in FIG. 11 begins with a complete test flow 1 (1110) on the memory array as described in FIG. 7. Test flow 1 is an attempt at programming and testing an entire magnetic memory array (MRAM). This includes writing and reading the entire array as well as finding acceptable adaptive column and row programming currents. If a successful Read or Test of the entire array occurs 1160, the method passes and signals that the memory array is suitable for use as a standard static RAM (SRAM), which can be Read and Written many times. If a Read or Test of the entire array FAILS 1140, the method goes to Test Flow 3 (1120), which is shown in FIG. 9. Test Flow 9 attempts to program the entire magnetic memory array one byte at a time. If a successful completion of Test Flow 3 (1120) occurs, the method passes and signals that the memory array is suitable for use as a one-time-programmable (OTP) Electrically Programmable Read only Memory (EPROM) Die 1170. If a completion of Test flow 3 Fails 1150 the method signals a bad die, which needs to be discarded 1130.

Figure 12:
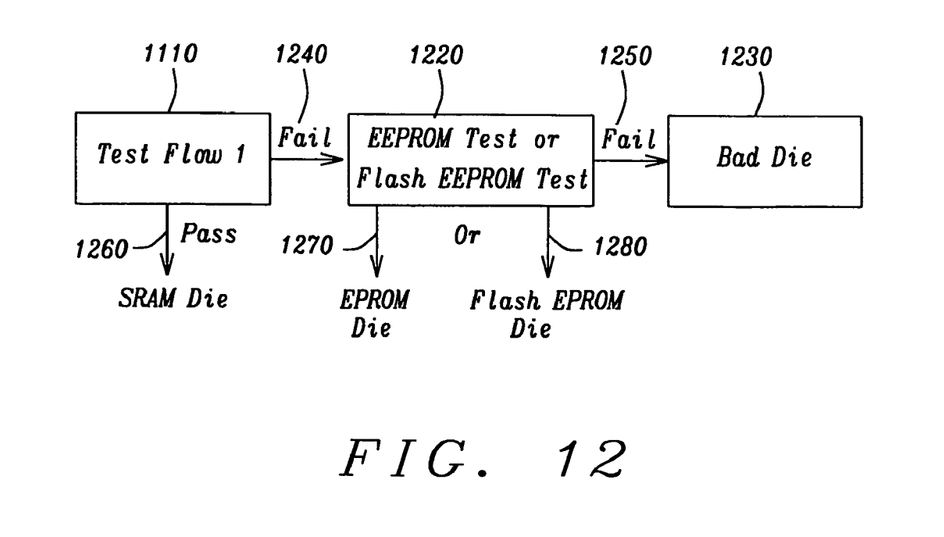
FIG. 12 which is the fifth embodiment of this invention is a method for programming, testing and sorting an MRAM chip to generate electrically eraseable programmable read only memory (EEPROM) or flash EEPROM with on chip adaptive row and column programming current and algorithm controller.

FIG. 12, which is the fifth embodiment of this invention is a method for programming, testing and sorting an MRAM chip to generate electrically erasable programmable read only memory (EEPROM) or flash EEPROM with on chip adaptive row and column programming current and algorithm controller. This implies that on a chip as described in FIG. 10, the algorithm controller 1075 is internal to the chip as shown in FIG. 10.

The method described in FIG. 12 begins with a complete test flow (1110) on the memory array as described in FIG. 7. Test flow 1 is an attempt at programming & testing an entire magnetic memory array (MRAM). This includes writing and reading the entire array as well as finding acceptable adaptive column and row programming currents. If a successful Read or Test of the entire array occurs 1260, the method passes and signals that the memory array is suitable for use as a standard static RAM (SRAM), which can be Read and Written many times. If a Read or Test of the entire array FAILS 1240, the method goes to Test Flow (1120), which is shown in FIG. 9. Test Flow 3 in FIG. 9 attempts to program the entire magnetic memory array one byte at a time. If a successful completion of Test Flow 3 occur, the method passes and signals that the memory array is suitable for use as an EEPROM Die (1270) or as a FLASH EEPROM (1280). If a completion of Test flow 3 Fails 1250, the method signals a bad die, which needs to be discarded 1230.

The advantages of this invention are that by adjusting the programming currents for each byte, the probability of programming every cell and not disturbing other cells in a memory array is greatly improved. This invention teaches the methods, designs, test algorithms and manufacturing flows to maximize the total yield of MRAM by programming, testing and sorting magnetic memory die or chips into SRAM, EEPROM, FLASH EEPROM and OTP EPROM applications.

While the invention has been described in terms of the preferred embodiments, those skilled in the art will recognize that various changes in form and details may be made without departing from the spirit and scope of the invention.

What is claimed is:

1. A magnetic random access (MRAM) memory circuit comprising:
    one or more memory sub arrays which interface with address registers and sense amps,
    one or more adaptive current generators,
    one or more row drivers which interface with said memory sub arrays,
    one or more column drivers which interface with said memory sub arrays,
    said address registers which interface with said memory sub arrays,
    data registers which interface with said memory sub arrays,
    address buffers which interface with address multiplexers,
    address multiplexer which interface with said memory sub arrays,
    said sense amps which interface with said memory sub arrays,
    I/O buffers which interface with said memory sub arrays,
    an algorithm controller, which resides internal to said memory circuit wherein said algorithm controller is designed to test and find said MRAM memories which can be used as static random access memories, SRAMs or alternatively as electrically erasable programmable read only memories, EEPROMs or Flash EEPROMs, or
    an algorithm controller which resides external to said memory circuit wherein said algorithm controller is designed to test and find said MRAM memories which can be used as one time programmable, OTP, EEPROMs.

2. The magnetic random (MRAM) memory circuit of claim 1 further comprising:
    address inputs which interface with said address multiplexer,
    bidirectional data inputs which interface with said memory sub arrays,
    chip enable input which interface with said algorithm controller,
    output enable input which interface with said algorithm controller, and
    control input which interface with said algorithm controller.

3. The magnetic random (MRAM) memory circuit of claim 1 wherein said memory sub arrays are comprised of a matrix of memory cells at intersections of rows and columns.

4. The magnetic random (MRAM) memory circuit of claim 3 wherein said intersections are magnetic memory storage cells.

5. The magnetic random (MRAM) memory circuit of claim 3 wherein said rows are word lines.

6. The magnetic random (MRAM) memory circuit of claim 3 wherein said columns are bit lines.

7. The magnetic random (MRAM) memory circuit of claim 5 wherein said row drivers connect with said word lines.

8. The magnetic random (MRAM) memory circuit of claim 6 wherein said column drivers connect with said bit lines.

9. The magnetic random (MRAM) memory circuit of claim 7 wherein said row drivers and said column drivers are driven from said adaptive current generator.

10. The magnetic random (MRAM) memory circuit of claim 1 wherein said algorithm controller controls said adaptive current generator.

11. The magnetic random (MRAM) memory circuit of claim 1 wherein said address registers store addresses of said memory cells to be accessed.

12. The magnetic random (MRAM) memory circuit of claim 1 wherein said data registers store data to be compared or written back to said memory cells.

13. The magnetic random (MRAM) memory circuit of claim 1 wherein said address buffers are driven by an external address bus.

14. The magnetic random (MRAM) memory circuit of claim 1 wherein said address multiplexer selects an address for said memory sub arrays from said address buffers or from said address registers.

15. The magnetic random (MRAM) memory circuit of claim 1 wherein said sense amps are used to read data stored in said memory sub arrays.

16. The magnetic random (MRAM) memory circuit of claim 1 wherein said I/O buffers are driven by an external bidirectional data bus.

17. The magnetic random (MRAM) memory circuit of claim 2 wherein said address inputs enable external access to said memory sub arrays.

18. The magnetic random (MRAM) memory circuit of claim 2 wherein said bidirectional data inputs are used to write and read said memory sub arrays.

19. The magnetic random (MRAM) memory circuit of claim 2 wherein said chip enable input is used to enable and disable data flow through said chip.

20. The magnetic random (MRAM) memory circuit of claim 2 wherein said output enable input is used to enable and disable said bidirectional data.

21. The magnetic random (MRAM) memory circuit of claim 2 wherein said control input enables writing, reading, and programming of said memory sub arrays.

* * * * *